US008916416B2

(12) United States Patent
Omandam et al.

(10) Patent No.: US 8,916,416 B2
(45) Date of Patent: Dec. 23, 2014

(54) SEMICONDUCTOR DEVICE AND METHOD OF LASER-MARKING LAMINATE LAYER FORMED OVER EWLB WITH TAPE APPLIED TO OPPOSITE SURFACE (75) Inventors: Glenn Omandam, Singapore (SG); Yaojian Lin, Singapore (SG); Hin Hwa Goh, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 292 days.

(21) Appl. No.: 12/889,588

(22) Filed: Sep. 24, 2010

(65) Prior Publication Data

US 2011/0012258 A1   Jan. 20, 2011
US 2013/0127039 A9   May 23, 2013

Related U.S. Application Data (63) Continuation-in-part of application No. 12/205,695, filed on Sep. 5, 2008, now Pat. No. 7,829,384.

(60) Provisional application No. 60/975,122, filed on Sep. 25, 2007.

(51) Int. Cl.
*H01L 21/00* (2006.01)
*H01L 23/00* (2006.01)
*B23K 26/00* (2014.01)

(52) U.S. Cl.
CPC ... *B23K 26/0042* (2013.01); *H01L 2924/13091* (2013.01); *H01L 24/19* (2013.01); *H01L 2924/18162* (2013.01); *H01L 2224/73267* (2013.01); *H01L 24/20* (2013.01); *H01L 2224/12105* (2013.01)
USPC ........... 438/106; 438/118; 257/E23.001; 257/E23.179

(58) Field of Classification Search
USPC ............... 438/106, 118, 690–692, 942; 257/E23.001, E23.179
See application file for complete search history.

(56) References Cited

U.S. PATENT DOCUMENTS

| | | | |
|---|---|---|---|
| 6,465,330 B1 * | 10/2002 | Takahashi et al. | 438/464 |
| 6,949,158 B2 * | 9/2005 | Ball et al. | 156/154 |
| 7,235,426 B2 | 6/2007 | Tsai | |
| 7,700,458 B2 | 4/2010 | Do et al. | |
| 2002/0168832 A1 * | 11/2002 | Peterson | 438/401 |
| 2003/0192866 A1 | 10/2003 | Han | |
| 2007/0080450 A1 * | 4/2007 | Kuan et al. | 257/737 |
| 2007/0111346 A1 * | 5/2007 | Tsai | 438/22 |
| 2007/0212812 A1 * | 9/2007 | Chow et al. | 438/106 |
| 2008/0029859 A1 * | 2/2008 | Do et al. | 257/673 |
| 2008/0251949 A1 * | 10/2008 | Sin et al. | 257/787 |

* cited by examiner

*Primary Examiner* — Daniel Whalen
(74) *Attorney, Agent, or Firm* — Robert D. Atkins; Patent Law Group: Atkins and Associates, P.C.

(57) ABSTRACT

A semiconductor device has a semiconductor die with a plurality of bumps formed on contact pads disposed over its active surface. An encapsulant is formed over the semiconductor die. An interconnect structure is formed over the semiconductor die and encapsulant. The semiconductor die is mounted to a translucent tape with the bumps embedded in the translucent tape. The translucent tape has layers of polyolefin, acrylic, and polyethylene terephthalate. A back surface of the semiconductor die undergoes backgrinding to reduce die thickness. The tape undergoes UV curing. A laminate layer is formed over the back surface of the semiconductor die. The laminate layer undergoes oven curing. The laminate layer is laser-marked while the tape remains applied to the bumps. The tape is removed after laser-marking the laminate layer. Alternately, the tape can be removed prior to laser-marking. The tape reduces die warpage during laser-marking.

34 Claims, 10 Drawing Sheets

SEMICONDUCTOR DEVICE AND METHOD OF LASER-MARKING LAMINATE LAYER FORMED OVER EWLB WITH TAPE APPLIED TO OPPOSITE SURFACE

CLAIM TO DOMESTIC PRIORITY

The present application is a continuation-in-part of U.S. application Ser. No. 12/205,695, now U.S. Pat. No. 7,829,348, filed Sep. 5, 2008, entitled "Semiconductor Device and Method of Laser-Marking Wafers with Tape Applied to Its Active Surface" by Glenn Omandam et al., which claims the benefit of U.S. Provisional Application No. 60/975,122, filed Sep. 25, 2007.

FIELD OF THE INVENTION

The present invention relates in general to semiconductor devices and, more particularly, to a semiconductor device and method of laser-marking a laminate layer formed over an eWLB with support of a tape applied to an opposite surface.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In the back-end manufacturing process, the wafers are commonly marked with a laser. The laser-marking may occur on the backside of the wafer to avoid damaging the active surface. The laser-marking can denote company logos and trademarks, identification of known good units, pin orientation, manufacturing history, lot number, time/date traceability, and component identification. For example, the marking can be used to facilitate traceability of the manufacturing process for fault analysis of semiconductor devices. The marking must be machine-readable, miniaturized and have no negative influence on the further manufacturing steps and still permit clear identification at the end of the process chain. The laser-marking can be numbers, letters, bar codes, dot matrix codes, and other identifying patterns and symbols.

In applications requiring both large bumps and thin wafers, wafer warpage or breakage is a recurring manufacturing issue in view of the bump height variation and stress of reflowing the large bumps on the thin wafer. The warped semiconductor wafers may have 0.8-1.0 millimeter (mm) variation across the surface.

Many laser-marking systems have difficulty processing wafers with a high degree of warping. When the wafer warpage reaches the range of 0.8-1.0 millimeter or above, the laser-marking machine encounters a vacuum error, as it cannot make a seal on the warped surface to pick up the wafer. In addition, the laser resolution degrades over the uneven warped surface. The laser-marking error interrupts the process flow, reduces yield, and increase manufacturing costs.

SUMMARY OF THE INVENTION

A need exists to laser-mark wafer-level packages which are susceptible to a high degree of warpage. Accordingly, in one embodiment, the present invention is a method of making a semiconductor device comprising the steps of providing a translucent tape, providing a semiconductor substrate having a plurality of bumps formed on contact pads disposed over its active surface, mounting the semiconductor substrate to the translucent tape with the bumps embedded in the translucent tape, grinding a back surface of the semiconductor substrate, opposite the active surface, to reduce substrate thickness, forming a laminate layer over the back surface of the semiconductor substrate, laser-marking the laminate layer while the translucent tape remains applied to the bumps, and removing the translucent tape after laser-marking the laminate layer.

In another embodiment, the present invention is a method of making a semiconductor device comprising the steps of providing a semiconductor die having a plurality of bumps formed over its active surface, mounting the semiconductor die to a tape with the bumps embedded in the tape, grinding a back surface of the semiconductor die, opposite the active surface, to reduce die thickness, forming a laminate layer over the back surface of the semiconductor die, laser-marking the laminate layer, and removing the tape.

In another embodiment, the present invention is a method of making a semiconductor device comprising the steps of providing a semiconductor substrate having a plurality of bumps formed over its active surface, mounting the semiconductor substrate to a tape with the bumps embedded in the tape, forming a laminate layer over a back surface of the semiconductor substrate, and laser-marking the laminate layer.

In another embodiment, the present invention is a semiconductor device comprising a semiconductor die having a plurality of bumps formed over its active surface. A tape is applied over the bumps. A laminate layer is formed over a back surface of the semiconductor die. The laminate layer is laser-marked.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
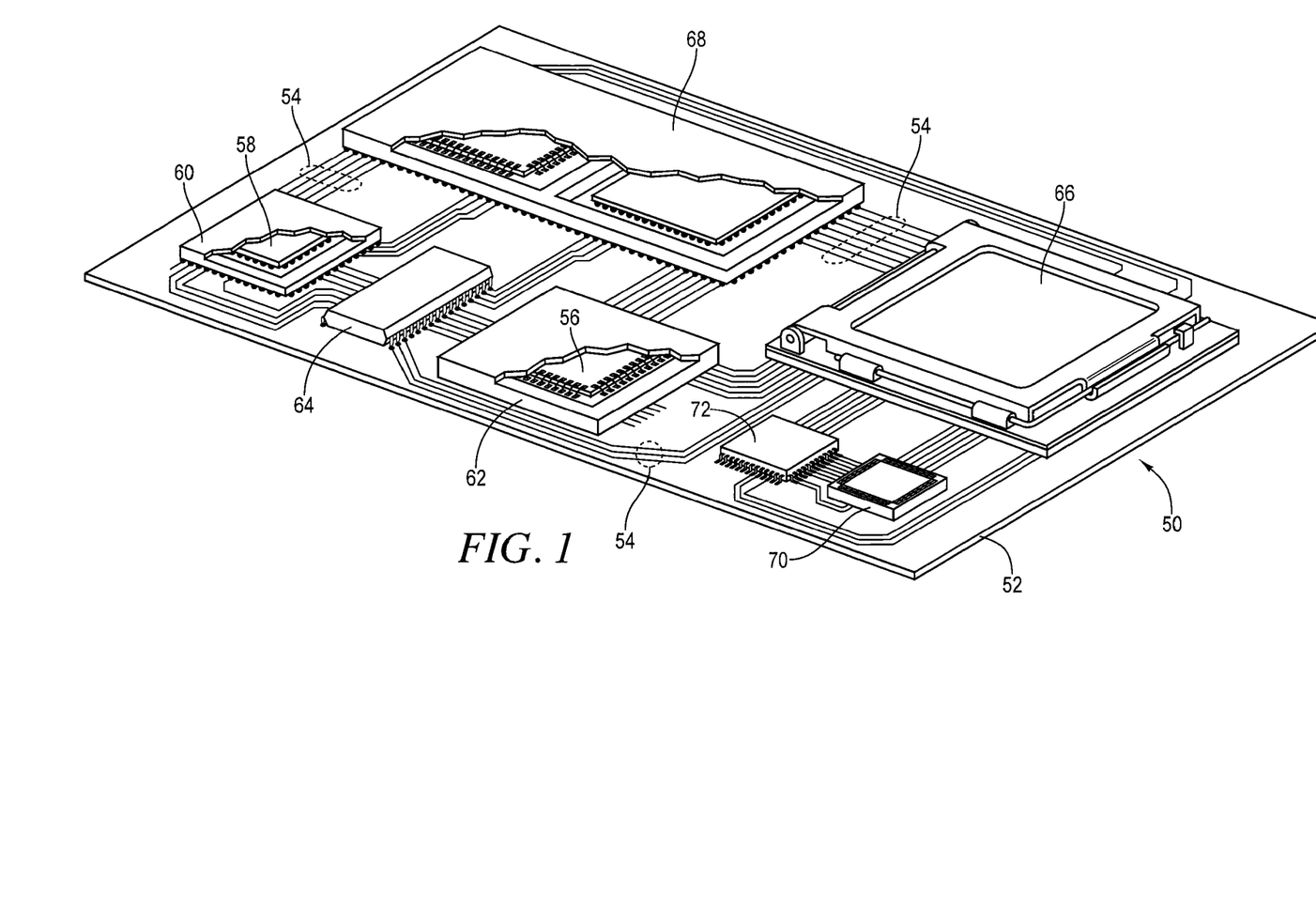
FIG. 1 illustrates a printed circuit board (PCB) with different types of packages mounted to its surface.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
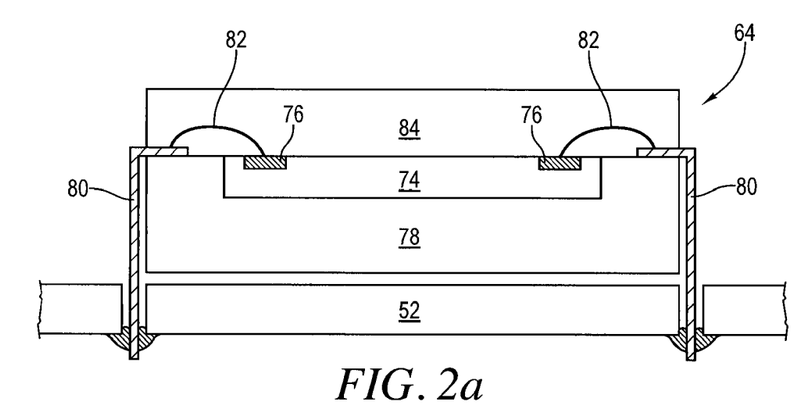
FIGS. 2a-2c illustrate further detail of the representative semiconductor packages mounted to the PCB.

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

Figure 2B:
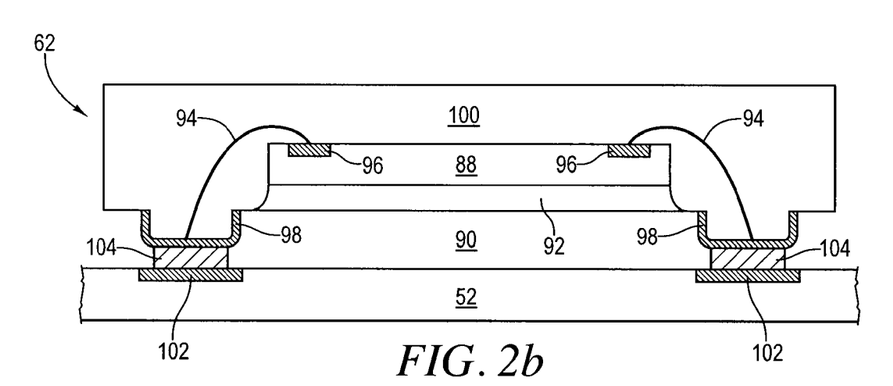

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

Figure 2C:
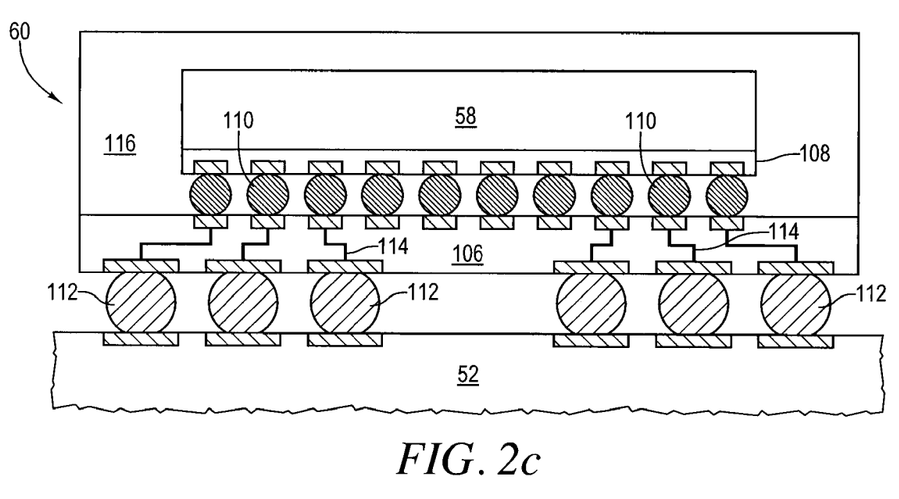

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
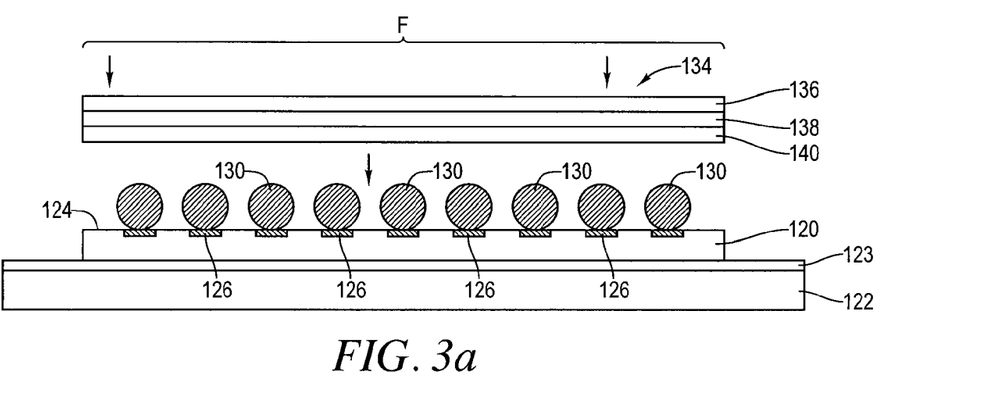
FIGS. 3a-3b illustrate application of backgrinding tape to solder bumps formed on an active surface of a semiconductor wafer.

FIG. 3a illustrates a semiconductor wafer 120 made with silicon, germanium, gallium arsenide, indium phosphide, or other bulk semiconductor material. Semiconductor wafer 120 is mounted to a substrate or carrier 122 containing a temporary or sacrificial base material such as silicon, polymer, beryllium oxide, or other suitable low-cost, rigid material for structural support. An optional interface layer or double-sided tape 123 is formed over carrier 122 as a temporary adhesive bonding film or etch-stop layer. Semiconductor wafer 120 may have an original thickness in the range of 700-800 micrometers (µm). In some cases as discussed below, the wafer thickness is reduced for smaller packaging. Semiconductor wafer 120 includes a plurality of semiconductor die each having active and passive devices, integrated passive devices (IPD), conductive layers, and dielectric layers formed on active surface 124 according to the electrical design of the die.

In particular, a metal layer is deposited over semiconductor wafer 120 using an evaporation, electrolytic plating, electroless plating, or screen printing process to form contact pads 126. Contact pads 126 can be titanium (Ti), Ni, nickel vanadium (NiV), Cu, or Cu alloy. Contact pads 126 connect to conductive layers in active surface 124 to provide the electrical interconnect for each semiconductor die.

An electrically conductive bump material is deposited over contact pads 126 using an evaporation, electrolytic plating, electroless plating, ball drop, or screen printing process. The bump material can be metal or electrically conductive material, e.g., Sn, Pb, Ni, Au, Ag, Cu, Bi, and alloys thereof. For example, the bump material can be eutectic Sn/Pb, high lead, or lead free. The bump material is reflowed by heating the bump material above its melting point to form bumps 130. In some applications, bumps 130 are reflowed a second time to improve electrical contact to contact pads 126. Bumps 130 are relatively large, on the order of 250-280 µm and more in height.

An ultraviolet (UV) backgrinding tape 134 is applied over bump structure 130. In one embodiment, UV backgrinding tape 134 includes layers of backing film 136, adhesive layer 138, and protective film 140. The backing film 136 can be polyolefin; the adhesive layer 138 can be acrylic; and the protective film 140 can be polyethylene terephthalate (PET). UV tape 134 is typically colorless or blue with optically translucent properties. The backgrinding tape 134 is pressed onto bump structure 130 with force F until protective layer 140 contacts active surface 124. The thickness of UV tape 134 is greater than or equal to the height of bumps 130.

Figure 3B:
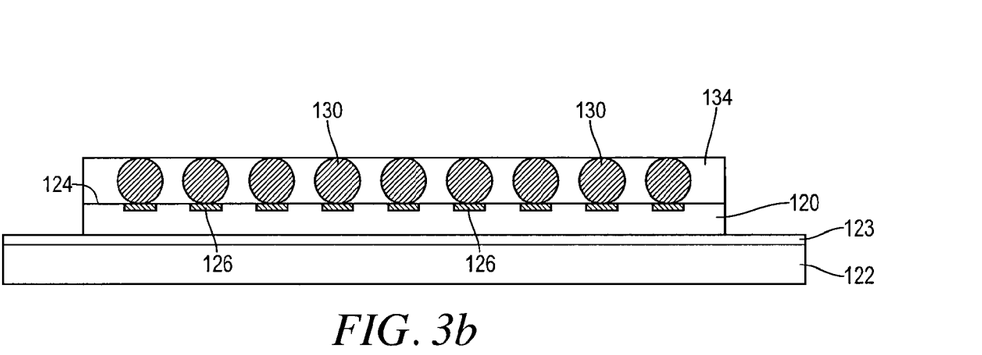

FIG. 3b shows backgrinding tape 134 surrounding bumps 130 and contacting active surface 124 and contact pads 126. In general, UV tape 134 is characterized by a strong adhesive strength upon application. The UV tape 134 is easily peeled away after exposure to UV radiation.

In many cases, it is desired to make semiconductor wafer 120 thinner. Accordingly, in FIG. 4, semiconductor wafer 120 is inverted and, leading with backgrinding tape 134, attached to temporary carrier 144 with an adhesive. Carrier 122 and interface layer 123 are then removed. A back surface of semiconductor wafer 120, opposite active surface 124, undergoes coarse backgrinding using a mechanical grinder 148. An additional wet etching step can be used for a finer removal of the bulk wafer material. Alternatively, plasma etching and/or a chemical-mechanical planarization (CMP) process can be used to remove a portion of the back surface of semiconductor wafer 120. The backgrinding process reduces the thickness of semiconductor wafer 120 by about 300-350 µm.

Figure 4:
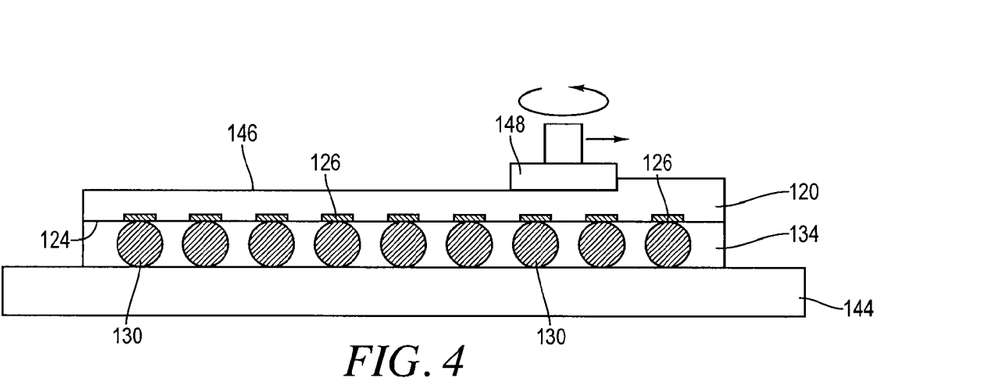
FIG. 4 illustrates backgrinding the wafer to reduce thickness.

Semiconductor wafers, as well as individual die, are marked with a laser. The laser-marking may occur on backside 146 of semiconductor wafer 120 to avoid damaging the active surface. The laser-marking can denote company logos and trademarks, identification of known good units, pin orientation, manufacturing history, lot number, time/date traceability, and component identification. For example, the marking can be used to facilitate traceability of the manufacturing process for fault analysis of semiconductor devices. The marking must be machine-readable, miniaturized and have no negative influence on the further manufacturing steps and still permit clear identification at the end of the process chain. The laser-marking can be numbers, letters, bar codes, dot matrix codes, and other identifying patterns and symbols.

Figure 5:
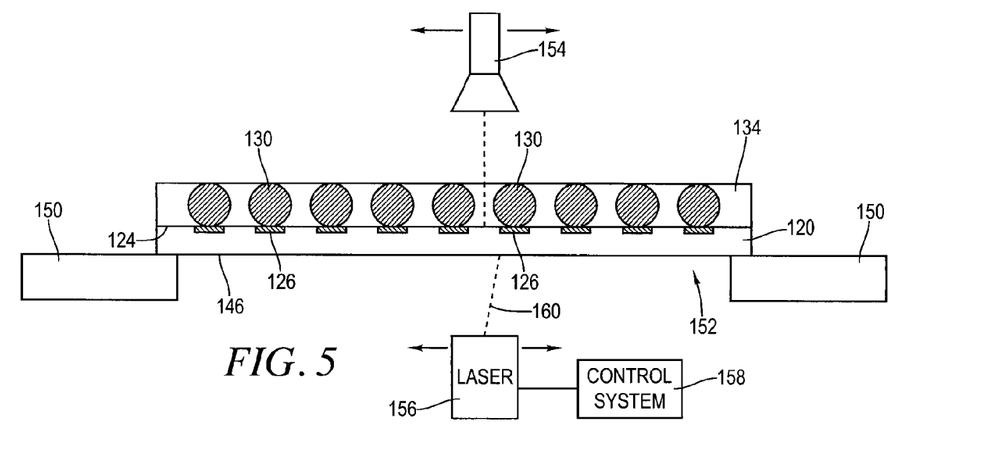
FIG. 5 illustrates a laser-marking system imaging surface patterns through the translucent tape in order to laser-mark the semiconductor wafer

To perform laser-marking, carrier 144 is removed and semiconductor wafer 120 is mounted to laser-marking table 120 with back surface 146 facing down, as shown in FIG. 5. The thin wafer 120 shown in FIG. 5 has already gone through the backgrinding process to reduce wafer thickness, as described in FIG. 4. Table 150 includes an opening 152 for the laser beam to radiate back surface 146 of semiconductor wafer 120. Optical recognition device 154, e.g., camera or active imaging, reads patterns on active surface 124 through translucent tape 134 and controls laser 156 accordingly. For example, optical recognition device 154 identifies demarcation lines between semiconductor die or other reference points on semiconductor wafer 120. Optical recognition device 154 also determines distances between reference points on semiconductor wafer 120.

Laser 156 is controlled by a vector marking program executing through a microcontroller, memory, and electronic interface in control system 158. The vector marking program in control system 158 controls the direction, intensity, speed of movement, and spread of laser beam 160 aimed at back surface 146 of semiconductor wafer 120. Either optical recognition device 154 and laser 156 move with respect to a fixed table 150, or table 150 moves with respect to a fixed optical recognition device 154 and laser 156. Laser beam 160 marks back surface 146 of semiconductor wafer 120 to imprint the laser-marking patterns and symbols. Laser 156 moves according to an x-y defined vector and is switched on and off along the vector to make precise and clean marks. Laser 156 may be carbon dioxide ($CO_2$), Q-switch, neodymium-doped yttrium aluminium garnet (Nd:YAG), excimer, or second harmonic generation (SHG) laser.

In applications requiring both large bumps and thin wafers, wafer warpage or breakage is a recurring manufacturing issue in view of the bump height variation and stress of reflowing the large bumps on the thin wafer. The backgrinding tape 134 on semiconductor wafer 120 reduces the warpage to about 0.3-0.5 mm. Thus, by leaving backgrinding tape 134 on semiconductor wafer 120 during laser-marking, wafers that would otherwise exhibit significant warpage, i.e., without tape, can be processed through the laser-marking system with reduced warpage due to the support of the backgrinding tape. The translucent properties of backgrinding tape 134 allow optical recognition device 154 to read through backgrinding tape 134 to recognize patterns on active surface 124. Thus, even with backgrinding tape 134 in place, optical recognition device 154 is able to image patterns on active surface 124 and control laser 156 to accurately mark back surface 146 of semiconductor wafer 120, as well as the individual die on the wafer.

Figure 6:
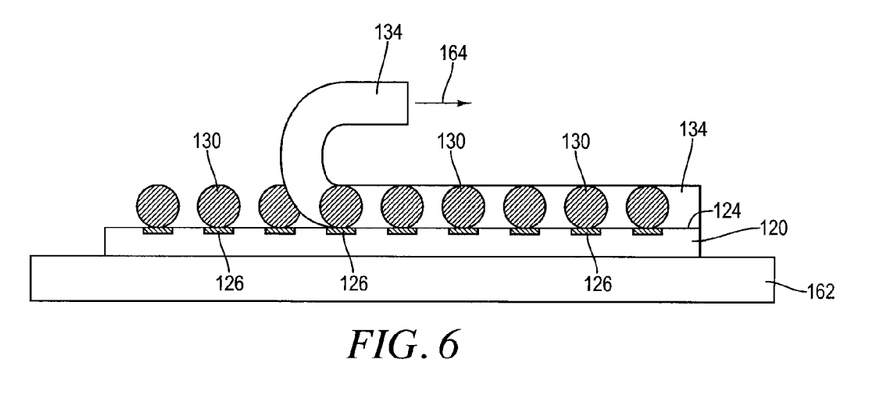
FIG. 6 illustrates removal of the backgrinding tape after laser-marking.

In FIG. 6, semiconductor wafer 120 is mounted to temporary carrier 162 after the laser-marking process. Backgrinding tape 134 is then removed by peeling in the direction of arrow 164. Alternatively, backgrinding tape 134 can be removed by stripping, etching, cleaning, or other suitable tape removal process.

By leaving backgrinding tape 134 on semiconductor wafer 120 while laser-marking, wafers which are susceptible to high warpage can be processed through the laser-marking system with reduced warpage. The backgrinding tape 134 reduces the amount of flex exhibited in semiconductor wafer 120 to a level that can be handled by the laser-marking system. With less flex in semiconductor wafer 120, i.e., flatter profile, the laser-marking system is able to hold vacuum while moving the wafer. In addition, the flatter surface increases resolution of the laser-mark. Since backgrinding tape 134 is providing a useful function during laser-marking, i.e., reducing wafer warpage, the tape is removed after laser-marking is complete.

Figure 7A:
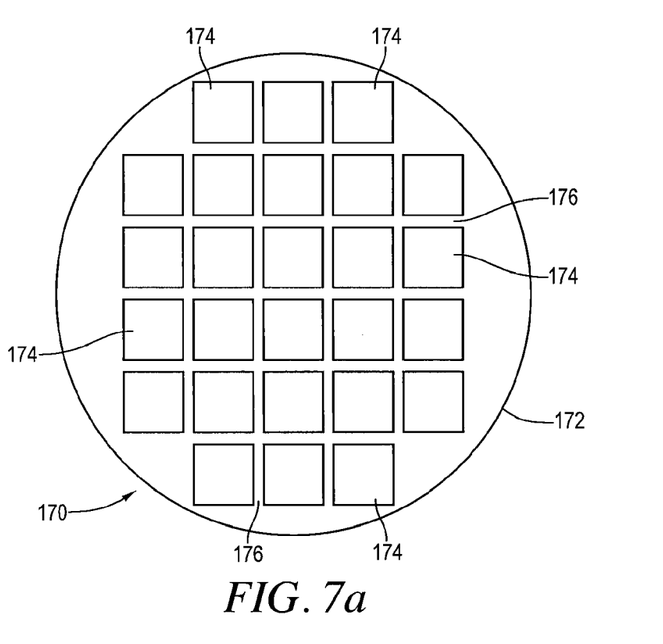
FIGS. 7a-7c illustrate a semiconductor wafer with a plurality of semiconductor die separated by saw streets.

FIG. 7a shows a semiconductor wafer 170 with a base substrate material 172, such as silicon, germanium, gallium arsenide, indium phosphide, or silicon carbide, for structural support. A plurality of semiconductor die or components 174 is formed on wafer 170 separated by saw streets 176 as described above.

Figure 7B:
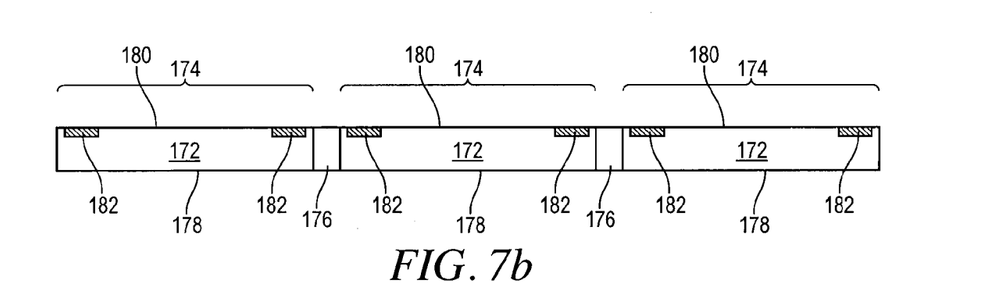

FIG. 7b shows a cross-sectional view of a portion of semiconductor wafer 170. Each semiconductor die 174 has a back surface 178 and an active surface 180 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 180 to implement analog circuits or digital circuits, such as digital signal processor (DSP), ASIC, memory, or other signal processing circuit. Semiconductor die 174 may also contain IPD, such as inductors, capacitors, and resistors, for RF signal processing. In one embodiment, semiconductor die 174 is a flipchip type semiconductor die.

An electrically conductive layer 182 is formed over active surface 180 using PVD, CVD, electrolytic plating, electroless plating process, or other suitable metal deposition process. Conductive layer 182 can be one or more layers of Al, Cu, Sn, Ni, Au, Ag, or other suitable electrically conductive material. Conductive layer 182 operates as contact pads electrically connected to the circuits on active surface 180.

Figure 7C:
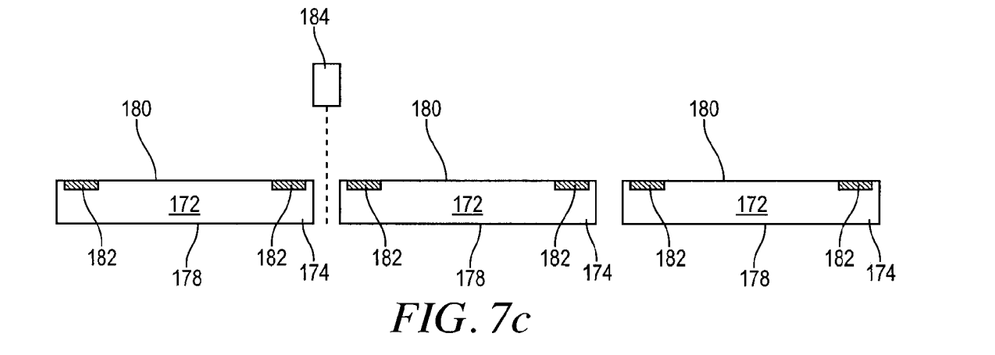

In FIG. 7c, semiconductor wafer 170 is singulated through saw street 176 using a saw blade or laser cutting tool 184 into individual semiconductor die 174.

Figure 8A:
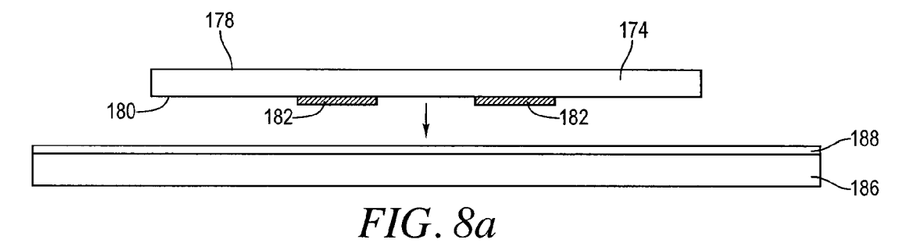
FIGS. 8a-8m illustrate a process of laser marking a laminate layer formed over an eWLB with support of a tape applied to an opposite surface.

FIGS. 8a-8m illustrate, in relation to FIGS. 1 and 2a-2c, a process of laser marking a laminate layer formed over an eWLB with support of UV tape over an opposite surface. FIG. 8a shows a portion of wafer-level substrate or carrier 186 containing temporary or sacrificial base material such as silicon, polymer, beryllium oxide, or other suitable low-cost, rigid material for structural support. An optional interface layer or double-sided tape 188 is formed over carrier 186 as a temporary adhesive bonding film or etch-stop layer. FIG. 8a shows the portion of wafer-level carrier 186 associated with one semiconductor die 174. FIG. 8a shows a portion of wafer-level carrier 186 associated with one semiconductor die. Carrier 186 extends beyond the dimensions shown in FIG. 8a for a wafer-level multi-die attachment.

Figure 8B:
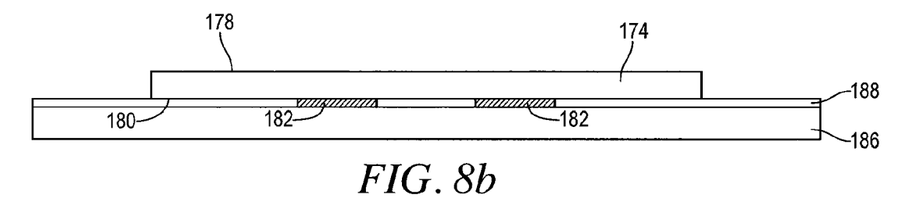

Semiconductor die or substrate 174 from FIGS. 7a-7c is positioned over carrier 186 using a pick and place operation with contact pads 182 oriented toward the carrier. FIG. 8b shows semiconductor die 174 mounted to interface layer 188 and carrier 186.

Figure 8C:
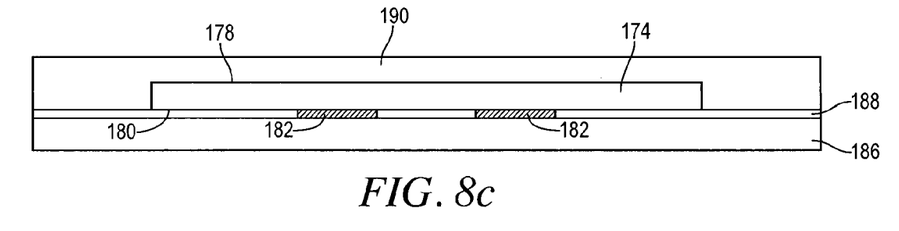

In FIG. 8c, an encapsulant or molding compound 190 is deposited over carrier 186 and semiconductor die 174 using a paste printing, compressive molding, transfer molding, liquid encapsulant molding, vacuum lamination, spin coating, or other suitable applicator. Encapsulant 190 can be polymer composite material, such as epoxy resin with filler, epoxy acrylate with filler, or polymer with proper filler. Encapsulant 190 is non-conductive and environmentally protects the semiconductor device from external elements and contaminants.

Figure 8D:
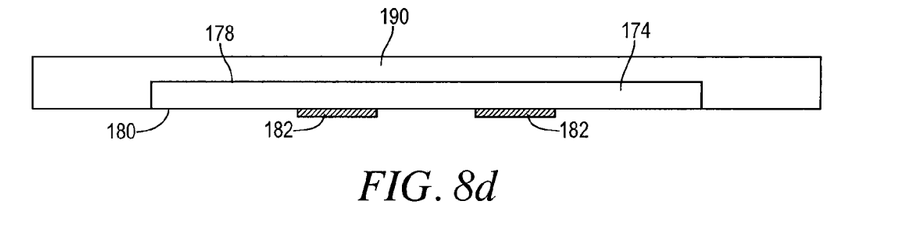

In FIG. 8d, carrier 186 and interface layer 188 are removed by chemical etching, mechanical peeling, CMP, mechanical grinding, thermal bake, UV light, laser scanning, or wet stripping to expose semiconductor die 174 and encapsulant 190.

Figure 8E:
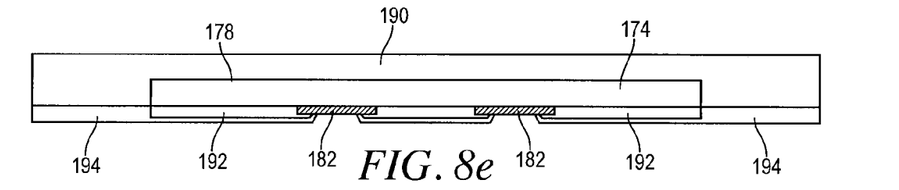

In FIG. 8e, an insulating or passivation layer 192 is formed over active surface 180 and conductive layer 182 of semiconductor die 174 using PVD, CVD, printing, spin coating, spray coating, sintering or thermal oxidation. The insulating layer 192 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. A portion of insulating layer 192 can be removed by an etching process to expose conductive layer 182.

An insulating or photoresist layer 194 is formed over insulating layer 192 and the exposed conductive layer 182 using PVD, CVD, printing, spin coating, spray coating, sintering or thermal oxidation. The insulating layer 194 contains one or more layers of $SiO_2$, $Si_3N_4$, SiON, $Ta_2O_5$, $Al_2O_3$, or other material having similar insulating and structural properties. A portion of insulating layer 194 can be removed by an etching process to expose conductive layer 182 for additional electrical interconnect.

Figure 8F:
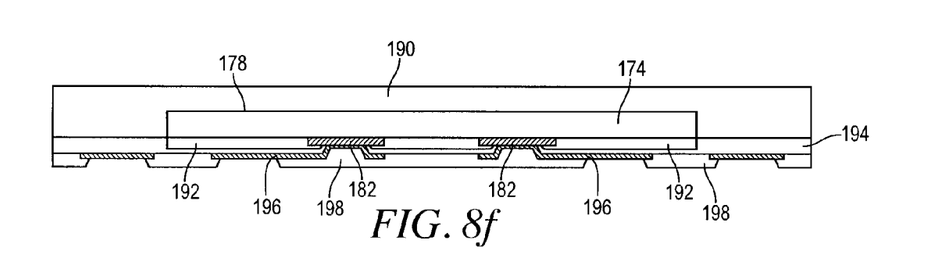

In FIG. 8f, an electrically conductive layer or redistribution layer (RDL) 196 formed using a patterning and metal deposition process such as sputtering, electrolytic plating, and electroless plating. Conductive layer 196 can be one or more layers of Al, Cu, Sn, Ni, Au, Ag, or other suitable electrically conductive material. One portion of conductive layer 196 is electrically connected to conductive layer 182. Other portions of conductive layer 196 can be electrically common or electrically isolated depending on the design and function of semiconductor die 174.

An insulating or passivation layer 198 is formed over insulating layer 194 and conductive layer 196 using PVD, CVD, printing, spin coating, spray coating, sintering or thermal oxidation. The insulating layer 198 contains one or more layers of $SiO_2$, $Si_3N_4$, SiON, $Ta_2O_5$, $Al_2O_3$, or other material having similar insulating and structural properties. A portion of insulating layer 198 can be removed by an etching process to expose conductive layer 196 for additional electrical interconnect.

Figure 8G:
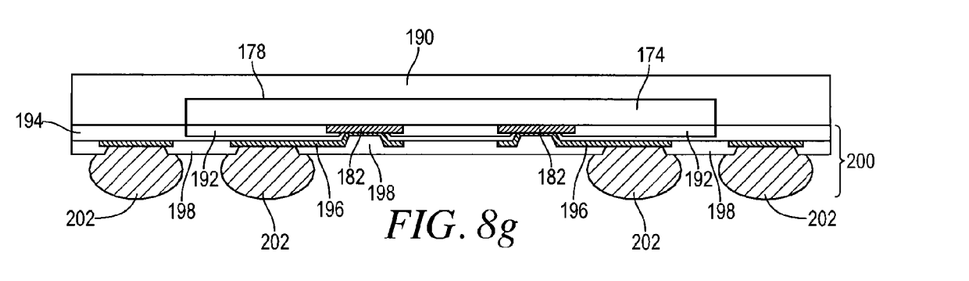

In FIG. 8g, an electrically conductive bump material is deposited over the exposed portion of conductive layer 196 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 196 using a suitable attachment or bonding process. In one embodiment, the bump material is reflowed by heating the material above its melting point to form spherical balls or bumps 202. Bump 202 can be relatively large, on the order of 250-280 µm and more in height. In some applications, bumps 202 are reflowed a second time to improve electrical contact to conductive layer 196. An under bump metallization (UBM) can be formed under bumps 202. The bumps can also be compression bonded to conductive layer 196. Bumps 202 represent one type of interconnect structure that can be formed over conductive layer 196. The interconnect structure can also use stud bump, micro bump, or other electrical interconnect. The combination of bumps 202, conductive layer 196, and insulating layers 192, 194, and 198 constitute a build-up interconnect structure 200.

Figure 8H:
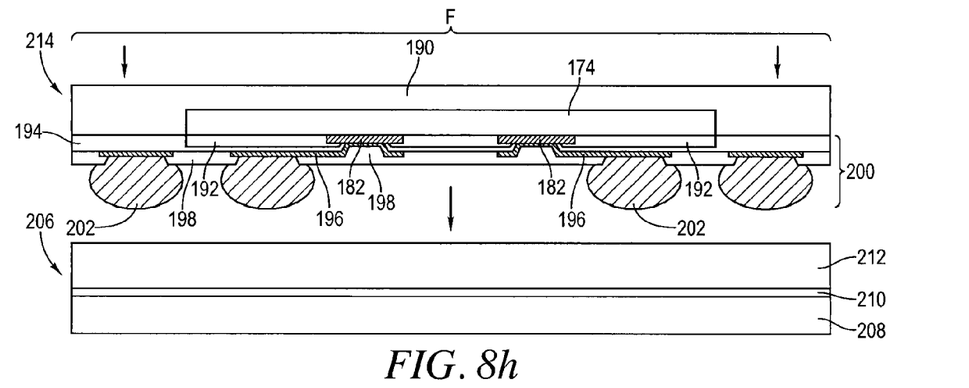

FIG. 8h shows a UV backgrinding tape 206 with base layer 208, adhesive layer 210, and resin layer 212. The base layer 208 can be polyolefin; the adhesive layer 210 can be acrylic; and the resin layer 212 can be PET. UV tape 206 is typically colorless or blue with optically translucent properties. The thickness of UV tape 206 is greater than or equal to the height of bumps 202. In general, tape 206 is characterized by a strong adhesive strength upon application.

Figure 8I:
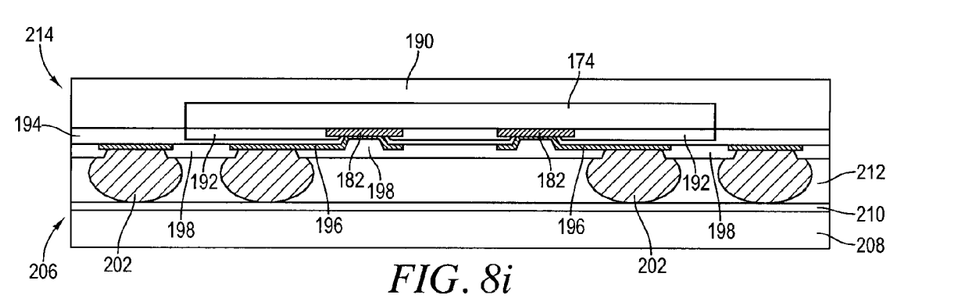

Semiconductor die 174 with encapsulant 190 and build-up interconnect structure 200 constitute an embedded wafer-level ball grid array (eWLB) 214. The eWLB 214 is positioned over UV tape 206 with bumps 202 oriented toward the tape. The eWLB 214 is pressed onto tape 206 with force F until resin layer 212 contacts insulating layer 198. Bumps 202 may contact base layer 208. FIG. 8i shows bumps 202 embedded within tape 206. FIGS. 8h-8i show a portion of UV backgrinding tape 206 associated with one semiconductor die 174. UV tape 206 extends beyond the dimensions shown in FIGS. 8h-8i for a wafer-level multi-die attachment.

Figure 8J:
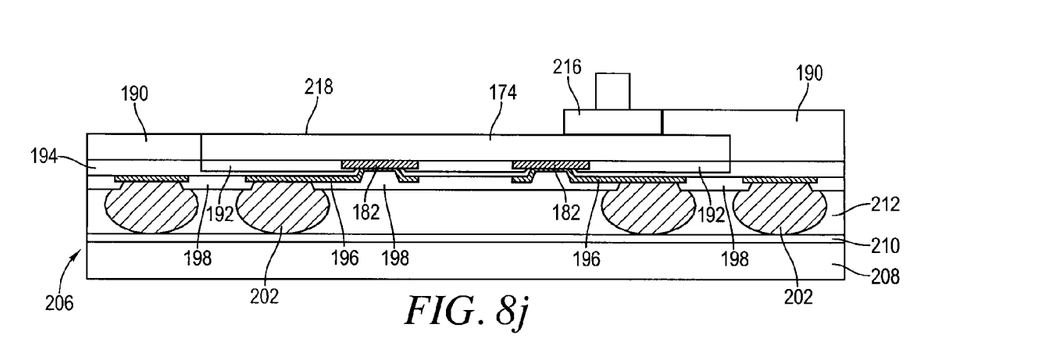

In many cases, it is desired to make eWLB 214 thinner, or at least planarize encapsulant 190 with the back surface of semiconductor die 174. Accordingly, after forming bumps 202, a portion of encapsulant 190 and the back surface of semiconductor die 174, opposite active surface 180, undergoes coarse backgrinding using a mechanical grinder 216, as shown in FIG. 8j. An additional wet etching step can be used for a finer removal of the bulk material. Alternatively, plasma etching and/or a CMP process can be used to remove a portion of encapsulant 190 and the back surface of semiconductor die 174. In one embodiment, the original thickness of eWLB 214 is 690 μm. After the grinding operation, encapsulant 190 is co-planar with back surface 218 of semiconductor die 174 and the thickness of eWLB 214 is about 225 μm. UV tape 206 acts as a substrate to provide support during the backgrinding and subsequent manufacturing steps.

The backgrinding tape 206 is UV cured at 8 millimeters/second with an intensity of 800-1200 milli-Joules to aid with later tape removal.

Figure 8K:
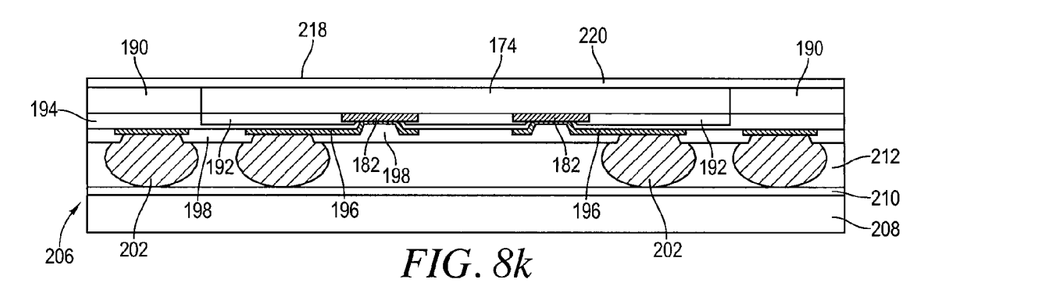

In FIG. 8k, a laminate layer 220 is formed over encapsulant 190 and back surface 218 of semiconductor die 174. In one embodiment, laminate layer 220 has a thickness of 25 μm. Laminate layer 220 can be polymer, plastic, b-stage material, metal foil, resin, composite, or other solid material. Laminate layer 220 can be applied with a roller or press under temperature in the range of 60-100° C. For embodiments with backgrinding tape 206, laminate layer 220 is cured with a thermal process, UV exposure, or microwave process, for example, oven curing at 100-150° C. for 0.5-6 hours to permanently adhere the laminate layer to encapsulant 190.

Figure 8L:
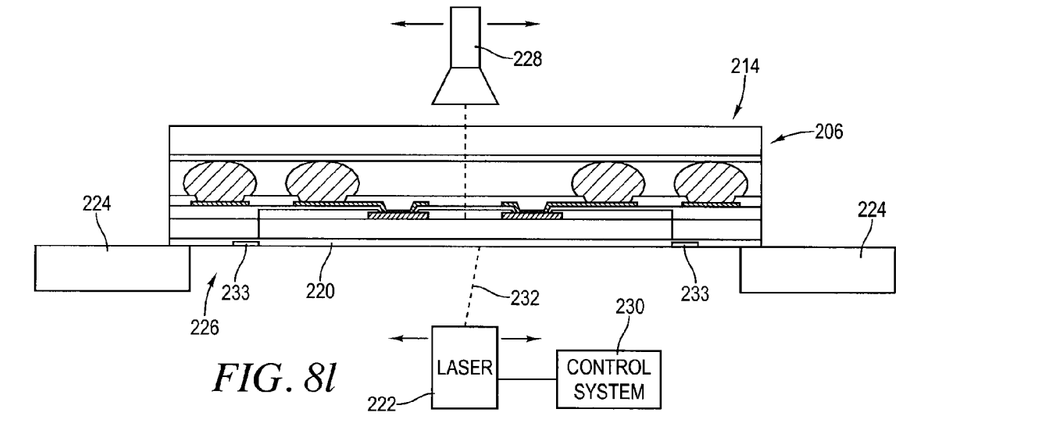

In FIG. 8l, laminate layer 220 is laser-marked with laser 222. The laser-marking can denote company logos and trademarks, identification of known good units, pin orientation, manufacturing history, lot number, time/date traceability, and component identification. For example, the marking can be used to facilitate traceability of the manufacturing process for fault analysis of semiconductor devices. The marking must be machine-readable, miniaturized and have no negative influence on the further manufacturing steps and still permit clear identification at the end of the process chain. The laser-marking can be numbers, letters, bar codes, dot matrix codes, and other identifying patterns and symbols.

To perform laser-marking, eWLB 214 with UV tape 206 is mounted to laser-marking table 224 with laminate layer 220 oriented face down. Table 224 includes an opening 226 for the laser beam to radiate laminate layer 220. An optical recognition device 228, e.g., camera or active imaging, reads patterns on build-up interconnect structure 200 or semiconductor die 174 and controls the laser accordingly. For example, optical recognition device 228 identifies demarcation lines and other reference points on eWLB 214. The optical recognition device 228 also determines distances between reference points on eWLB 214.

Laser 222 is controlled by a vector marking program executing through a microcontroller, memory, and electronic interface in control system 230. The vector marking program in control system 230 controls the direction, intensity, speed of movement, and spread of laser beam 232 aimed at eWLB 214. Either optical recognition device 228 and laser 222 move with respect to a fixed table 224, or table 224 moves with respect to a fixed optical recognition device 228 and laser 222. Laser beam 232 marks laminate layer 220 to imprint the laser-marking patterns and symbols 233. Laser 222 moves according to an x-y defined vector and is switched on and off along the vector to make precise and clean marks 233. Laser 222 may be CO2, Q-switch, Nd:YAG, excimer, or SHG laser.

In applications requiring both large bumps and thin wafers, wafer warpage or breakage is a recurring manufacturing issue in view of the bump height variation and stress of reflowing the large bumps on the thin wafer. UV backgrinding tape 206 on eWLB 214 reduces the warpage to about 0.3-0.5 mm. Thus, by leaving tape 206 on eWLB 214 during laser-marking, wafers that would otherwise exhibit significant warpage, i.e., without tape, can be processed through the laser-marking system with reduced warpage due to the support of the backgrinding tape. The translucent properties of UV tape 206 allow the optical recognition device to read through the tape to recognize patterns on build-up interconnect structure 200. Thus, even with UV tape 206 in place, the optical recognition device is able to image patterns on build-up interconnect structure 200 and control laser 222 to accurately mark laminate layer 220.

Figure 8M:
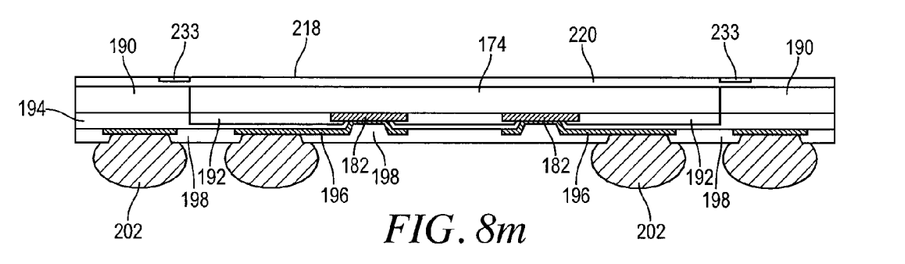

In FIG. 8m, UV backgrinding tape 206 is removed by peeling. Alternatively, backgrinding tape 206 can be removed by stripping, etching, cleaning, or other suitable tape removal process. The eWLB 214 are singulated through encapsulant 190 and build-up interconnect structure 200 into individual semiconductor packages.

By leaving backgrinding tape 206 on eWLB 214 while laser-marking, semiconductor die which are susceptible to high warpage can be processed through the laser-marking system with reduced warpage. The backgrinding tape 206 reduces the amount of flex exhibited in eWLB 214 to a level that can be handled by the laser-marking system. With less flex in eWLB 214, i.e., flatter profile, the laser-marking system is able to hold vacuum while moving the eWLB 214. In addition, the flatter surface increases resolution of the laser-mark. Since backgrinding tape 206 is providing a useful function during laser-marking, i.e., reducing warpage, the tape is removed after laser-marking is complete.

In another embodiment, similar to FIGS. 8a-8m, UV curing of tape 206 occurs after laminate layer 220 is formed to aid with later tape removal. The oven curing of laminate layer 220 occurs after the UV curing to permanently adhere the laminate layer to encapsulant 190.

In another embodiment, similar to FIGS. 8a-8m, no UV curing is performed. The oven curing of laminate layer 220 occurs after the laminate layer is formed to permanently adhere the laminate layer to encapsulant 190.

Figure 9A:
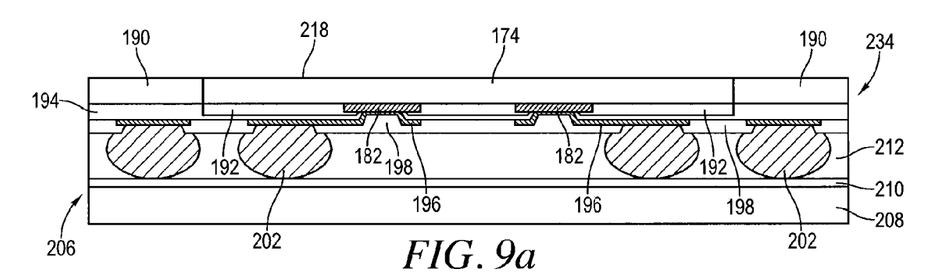
FIGS. 9a-9e illustrate another process of laser marking a laminate layer formed over an eWLB with support of a tape applied to an opposite surface.
Figure 9B:
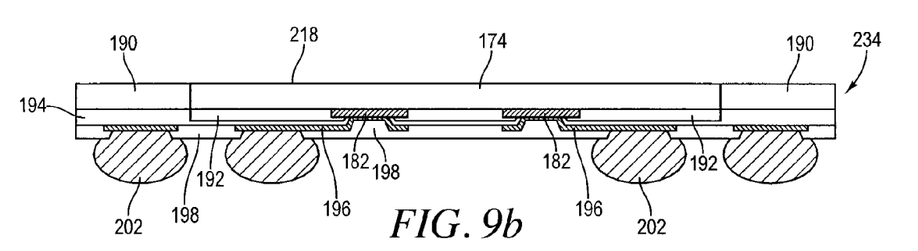

FIGS. 9a-9e show another embodiment of eWLB 234, continuing from FIG. 8j. In FIG. 9a, backgrinding tape 206 is UV cured following the backgrinding operation. The UV curing occurs at 8 millimeters/second with an intensity of 800-1200 milli-Joules to aid with later tape removal. In FIG. 9b, UV backgrinding tape 206 is removed before curing lamination layer 236 by peeling, stripping, etching, cleaning, or other suitable tape removal process.

Figure 9C:
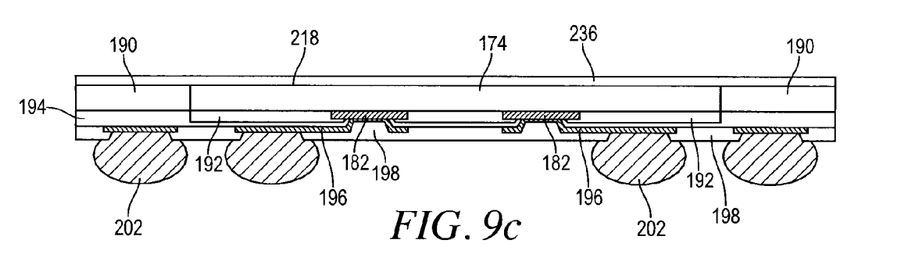

In FIG. 9c, a laminate layer 236 is formed over encapsulant 190 and back surface 218 of semiconductor die 174. In one embodiment, laminate layer 236 has a thickness of 25 μm. Laminate layer 236 can be polymer, plastic, b-stage material, metal foil, resin, composite, or other solid material. Laminate layer 236 can be applied with a roller or press under temperature in the range of 60-80° C. Laminate layer 236 is oven cured at 130° C. for 2 hours to permanently adhere the laminate layer to encapsulant 190.

Figure 9D:
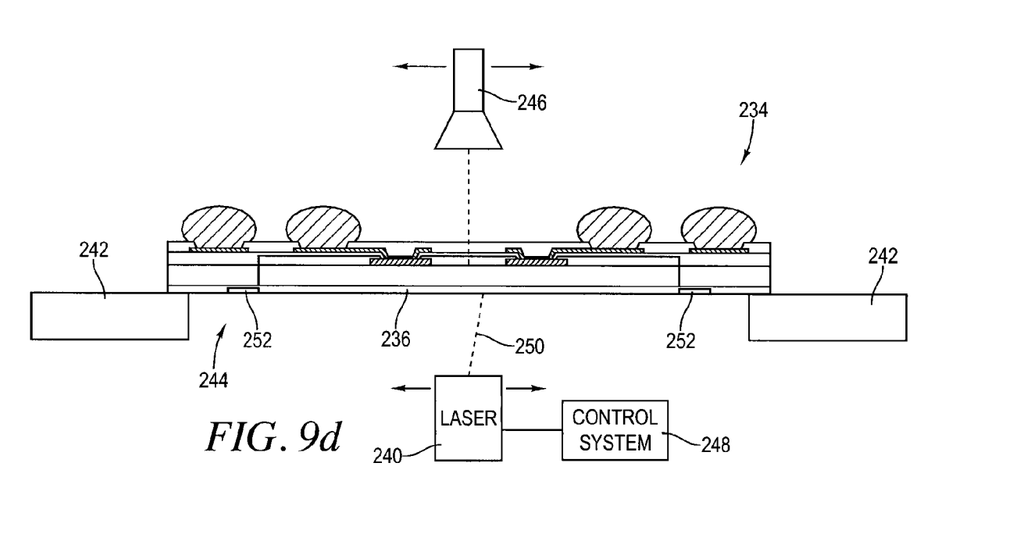

In FIG. 9d, laminate layer 236 is laser-marked with laser 240. The laser-marking can denote company logos and trademarks, identification of known good units, pin orientation, manufacturing history, lot number, time/date traceability, and component identification. For example, the marking can be used to facilitate traceability of the manufacturing process for fault analysis of semiconductor devices. The marking must be machine-readable, miniaturized and have no negative influence on the further manufacturing steps and still permit clear identification at the end of the process chain. The laser-marking can be numbers, letters, bar codes, dot matrix codes, and other identifying patterns and symbols.

To perform laser-marking, eWLB 234 is mounted to laser-marking table 242 with laminate layer 236 oriented face down. Table 242 includes an opening 244 for the laser beam to radiate laminate layer 236. An optical recognition device 246, e.g., camera or active imaging, reads patterns on build-up interconnect structure 200 or semiconductor die 174 and controls the laser accordingly. For example, optical recognition device 246 identifies demarcation lines and other reference points on eWLB 234. The optical recognition device 246 also determines distances between reference points on eWLB 234.

Laser 240 is controlled by a vector marking program executing through a microcontroller, memory, and electronic interface in control system 248. The vector marking program in control system 248 controls the direction, intensity, speed of movement, and spread of laser beam 250 aimed at eWLB 234. Either optical recognition device 246 and laser 240 move with respect to a fixed table 242, or table 242 moves with respect to a fixed optical recognition device 246 and laser 240. Laser beam 250 marks laminate layer 236 to imprint the laser-marking patterns and symbols 252. Laser 240 moves according to an x-y defined vector and is switched on and off along the vector to make precise and clean marks 252. Laser 240 may be CO2, Q-switch, Nd:YAG, excimer, or SHG laser.

Figure 9E:
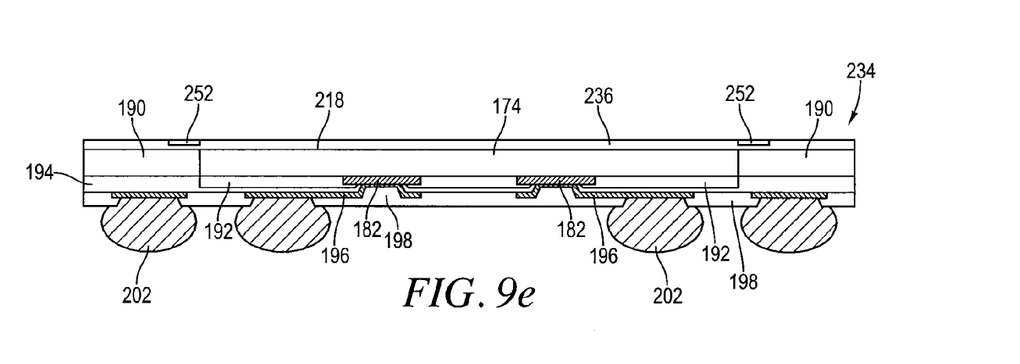

The eWLB 234 are removed from table 242 and singulated through encapsulant 190 and build-up interconnect structure 200 into individual semiconductor packages, as shown in FIG. 9e.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a translucent tape;
    providing a semiconductor substrate;
    depositing an encapsulant over the semiconductor substrate;
    forming an interconnect structure over the semiconductor substrate and encapsulant, the interconnect structure including a redistribution layer and plurality of bumps coupled to the redistribution layer;
    disposing the semiconductor substrate on the translucent tape with the bumps embedded in the translucent tape;
    removing a portion of the semiconductor substrate and encapsulant opposite the interconnect structure;
    forming a laminate layer over a surface of the semiconductor substrate and encapsulant opposite the interconnect structure;
    laser-marking the laminate layer controlled by pattern recognition through the translucent tape with the bumps embedded in the translucent tape; and
    removing the translucent tape after laser-marking the laminate layer.

2. The method of claim 1, wherein the translucent tape reduces a substrate warpage during laser-marking.

3. The method of claim 1, wherein the translucent tape includes layers of polyolefin, acrylic, and polyethylene terephthalate.

4. The method of claim 1, further including ultraviolet curing the translucent tape.

5. The method of claim 1, further including curing the laminate layer.

6. The method of claim 1, wherein forming the interconnect structure includes:
    forming a first insulating layer within a boundary of the semiconductor substrate;
    forming a second insulating over the first insulating layer and encapsulant;
    forming the redistribution layer over the second insulating layer; and
    forming the bumps over the redistribution layer.

7. The method of claim 1, wherein the translucent tape includes a base layer, adhesive layer, and resin layer with the bumps embedded in the resin layer.

8. A method of making a semiconductor device, comprising:
    providing a semiconductor die
    depositing an encapsulant over the semiconductor die;
    forming an interconnect structure over the semiconductor die and encapsulant, the interconnect structure including a conductive layer and plurality of bumps coupled to the conductive layer;
    disposing the semiconductor die over a translucent tape with the bumps embedded in the translucent tape;
    removing a portion of the semiconductor die and encapsulant opposite the interconnect structure;
    forming a laminate layer directly on a surface of the semiconductor die and encapsulant opposite the translucent tape; and
    marking a location on the laminate layer opposite the translucent tape, the marking location being determined by pattern recognition through the translucent tape.

9. The method of claim 8, wherein the translucent tape includes a base layer, adhesive layer, and resin layer with the bumps embedded in the resin layer.

10. The method of claim 8, further including ultraviolet curing the translucent tape.

11. The method of claim 8, further including curing the laminate layer.

12. The method of claim 8, wherein forming the interconnect structure includes:
    forming an insulating layer over the semiconductor die;
    forming the conductive layer over the insulating layer; and
    forming the bumps over the conductive layer.

13. A method of making a semiconductor device, comprising:
    providing a semiconductor die;
    depositing an encapsulant over the semiconductor die;

forming an interconnect structure including a plurality of bumps over the semiconductor die and encapsulant;

disposing the semiconductor die on a tape with the bumps embedded in the tape;

removing a portion of the semiconductor die and encapsulant opposite the interconnect structure;

forming a laminate layer over a surface of the semiconductor die and encapsulant opposite the interconnect structure;

laser-marking the laminate layer, wherein the tape reduces a die warpage during laser-marking; and removing the tape.

14. The method of claim 13, wherein the tape includes a base layer, adhesive layer, and resin layer with the bumps embedded in the resin layer.

15. The method of claim 13, further including ultraviolet curing the tape.

16. The method of claim 13, further including curing the laminate layer.

17. The method of claim 13, wherein the tape is optically translucent.

18. The method of claim 13, wherein forming the interconnect structure includes:

forming an insulating layer over the semiconductor die;

forming a conductive layer over the insulating layer; and forming the bumps over the conductive layer.

19. A method of making a semiconductor device, comprising:

providing a semiconductor substrate;

depositing an encapsulant over the semiconductor substrate;

forming an interconnect structure over the semiconductor substrate and encapsulant;

disposing the semiconductor substrate over a translucent tape;

removing a portion of the semiconductor substrate and encapsulant;

forming a laminate layer on a surface of the semiconductor substrate and encapsulant opposite the interconnect structure; and marking a location on the laminate layer opposite the translucent tape, the marking location being determined by pattern recognition through the translucent tape.

20. The method of claim 19, further including ultraviolet curing the translucent tape.

21. The method of claim 19, further including curing the laminate layer.

22. The method of claim 19, wherein forming the interconnect structure includes:

forming an insulating layer over the semiconductor substrate;

forming a conductive layer over the insulating layer; and forming a plurality of bumps over the conductive layer.

23. The method of claim 22, wherein the translucent tape includes a base layer, adhesive layer, and resin layer with the bumps embedded in the resin layer.

24. A method of making a semiconductor device, comprising:

providing a semiconductor substrate;

depositing an encapsulant over the semiconductor substrate;

forming an interconnect structure including a plurality of bumps over the semiconductor substrate and encapsulant;

disposing the semiconductor substrate on a tape with the bumps embedded in the tape;

removing a portion of the semiconductor substrate and encapsulant;

forming a laminate layer over a surface of the semiconductor substrate and encapsulant opposite the interconnect structure;

laser-marking the laminate layer; and removing the tape after laser-marking the laminate layer.

25. The method of claim 24, further including ultraviolet curing the tape.

26. The method of claim 24, further including curing the laminate layer.

27. The method of claim 24, further including removing the tape before curing the laminate layer.

28. The method of claim 24, wherein forming the interconnect structure includes:

forming an insulating layer over the semiconductor substrate;

forming a conductive layer over the insulating layer; and forming the bumps over the conductive layer.

29. The method of claim 24, wherein the tape includes a base layer, adhesive layer, and resin layer with the bumps embedded in the resin layer.

30. A method of making a semiconductor device, comprising:

providing a semiconductor substrate;

depositing an encapsulant over the semiconductor substrate;

forming an interconnect structure over the semiconductor substrate and encapsulant;

providing a translucent tape;

disposing the semiconductor substrate over the translucent tape;

removing a portion of the semiconductor substrate and encapsulant;

forming a laminate layer on the encapsulant and the semiconductor substrate opposite the interconnect structure;

marking the laminate layer controlled by pattern recognition through the translucent tape; and removing the tape after marking the laminate layer.

31. The method of claim 30, further including curing the laminate layer.

32. The method of claim 31, further including removing the tape before curing the laminate layer.

33. The method of claim 30, wherein forming the interconnect structure includes:

forming an insulating layer over the semiconductor substrate;

forming a conductive layer over the insulating layer; and forming a plurality of bumps over the conductive layer.

34. The method of claim 33, wherein the translucent tape includes a base layer, adhesive layer, and resin layer with the bumps embedded in the resin layer.

* * * * *